(12) United States Patent
Deokar et al.

(10) Patent No.: US 10,964,979 B2
(45) Date of Patent: Mar. 30, 2021

(54) CELL AGNOSTIC BATTERY PACK

(71) Applicant: SCHNEIDER ELECTRIC IT CORPORATION, West Kingston, RI (US)

(72) Inventors: Vishwas Mohaniraj Deokar, Acton, MA (US); Lynn Ernest Schultz, Nashua, NH (US); Eyob Demissie, Lowell, MA (US); Andrew Chase, Boston, MA (US)

(73) Assignee: SCHNEIDER ELECTRIC IT CORPORATION, Foxboro, MA (US)

(*) Notice: Subject to any disclaimer, the term of this patent is extended or adjusted under 35 U.S.C. 154(b) by 94 days.

(21) Appl. No.: 15/865,572

(22) Filed: Jan. 9, 2018

(65) Prior Publication Data

US 2018/0198178 A1 Jul. 12, 2018

Related U.S. Application Data

(60) Provisional application No. 62/444,649, filed on Jan. 10, 2017.

(51) Int. Cl.
| | |
|---|---|
| *H01M 10/48* | (2006.01) |
| *H01M 10/42* | (2006.01) |
| *H02J 7/00* | (2006.01) |
| *H01M 10/0525* | (2010.01) |
| *G01R 31/382* | (2019.01) |
| *H01M 10/052* | (2010.01) |
| *H01M 10/6563* | (2014.01) |
| *G01R 31/396* | (2019.01) |

(52) U.S. Cl.
CPC ........ *H01M 10/482* (2013.01); *G01R 31/382* (2019.01); *H01M 10/0525* (2013.01); *H01M 10/425* (2013.01); *H01M 10/48* (2013.01); *H02J 7/0021* (2013.01); *G01R 31/396* (2019.01); *H01M 10/052* (2013.01); *H01M 10/6563* (2015.04); *H01M 2010/4271* (2013.01); *H01M 2010/4278* (2013.01)

(58) Field of Classification Search
None
See application file for complete search history.

(56) References Cited

U.S. PATENT DOCUMENTS

| | | |
|---|---|---|
| 8,482,155 B2 | 7/2013 | Choi et al. |
| 9,780,591 B2 | 10/2017 | Deokar et al. |
| 2013/0234669 A1 | 9/2013 | Huang et al. |
| 2016/0093848 A1 | 3/2016 | DeKeuster et al. |

FOREIGN PATENT DOCUMENTS

WO 2012125616 A1 9/2012

OTHER PUBLICATIONS

Extended European Search Report from corresponding European Application No. 18150847.4 dated Apr. 30, 2018.

*Primary Examiner* — Tracy M Dove
(74) *Attorney, Agent, or Firm* — Lando & Anastasi, LLP

(57) ABSTRACT

A cell agnostic battery pack that is capable of receiving sub-modules including lithium-ion cells regardless of form factor type, technology or supplier is described. The battery pack includes a chassis comprising compartments for receiving lithium-ion cells in the form of sub-modules that are connectable in series, parallel or series and parallel, and a battery pack controller. The battery pack further comprises internal interconnects adapted for coupling the sub-modules received in the compartments to the battery pack controller to create a target pack voltage and energy density.

20 Claims, 6 Drawing Sheets

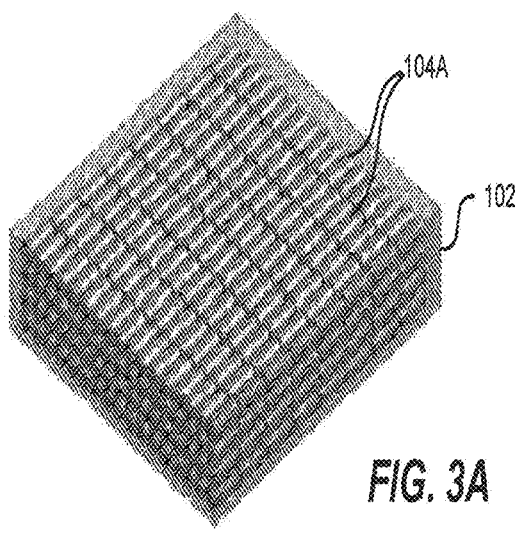
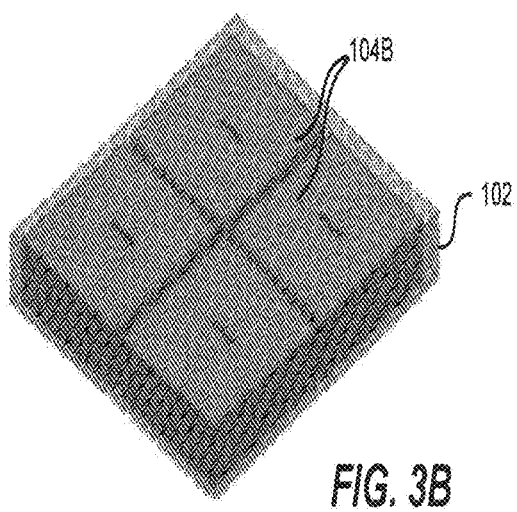
FIG. 3A
FIG. 3B

CELL AGNOSTIC BATTERY PACK

CROSS-REFERENCE TO RELATED APPLICATIONS

This application claims priority under 35 U.S.C. § 119(e) to U.S. provisional application Ser. No. 62/444,649 titled "CELL AGNOSTIC BATTERY PACK," filed Jan. 10, 2017, which is incorporated herein in its entirety for all purposes.

BACKGROUND

An electric battery is a device including one or more electrochemical cells that convert stored chemical energy into electrical energy. There are different types of battery technology. Lithium-ion is an example of an emerging battery cell technology that is popular in mobile devices, power tools, electric vehicles and energy storage applications. Common lithium-ion batteries use a lithium compound as one electrode material and carbon as another electrode material. In a discharge process of a typical lithium-ion battery, lithium ions move from a negative electrode to a positive electrode, through an electrolyte, generating a voltage. Lithium-ion battery technology has a number of advantages including long battery life, improved energy density and wide operating temperature range. Cell suppliers typically offer batteries based on different lithium-ion cell technologies and having different form factors (i.e., shape and size).

SUMMARY

In accordance with some embodiments, a cell agnostic battery module comprises a chassis having compartments for receiving sub-modules of a first type and a second type. The sub-modules include lithium-ion cells and can be connected in series, parallel or series and parallel. The battery module further comprises a battery pack controller, and internal interconnects adapted for coupling the sub-modules received in the compartments to the battery pack controller. The internal interconnects, in some aspects, can include a sub-module power bus adapted for coupling a power connector on the battery pack controller with complementary power connectors on the sub-modules and a sub-module communication bus adapted for coupling at least one communication connector on the battery pack controller with complementary communication connectors on the sub-modules. In further aspects, the internal interconnects comprise low voltage power adapted for coupling with a power and ground connector on the battery pack controller with complementary power and ground connectors on the sub-modules to supply low voltage power to the sub-modules. In other aspects, the internal interconnects further comprise a digital I/O adapted for coupling a digital I/O connector on the battery pack controller with complementary digital I/O connectors on the sub-modules to receive/send a digital I/O signal. In some aspects, the battery pack controller further comprises external interconnects adapted for coupling with signal and power connectors on the battery pack controller.

In some aspects, the sub-modules of the first type and the second type comprise lithium-ion battery cells of different form factor type. The form factor type is one of cylindrical type, pouch type or prismatic type. In other aspects, the sub-modules of the first type and the second type include sub-modules from different suppliers. In yet other aspects, the sub-modules of the first type and the second type include sub-modules using different cell technologies.

In some aspects, the chassis further comprises one or more fans to provide airflow through an interior of the chassis. In further aspects, the chassis can comprise a metal bezel attached to a front end. The metal bezel may have a ventilation pattern to provide airflow through the interior of the chassis.

In accordance with some embodiments, a battery module comprises a chassis having at least two compartments configured to receive at least two sub-modules. Each sub-module may comprise lithium-ion cells of cylindrical type, pouch type or prismatic type. The at least two sub-modules may be connected in series or parallel to provide a target pack voltage and a target energy density. The battery module includes a battery module controller disposed in the chassis. The battery module controller may be electrically coupled with the at least two sub-modules via internal interconnects comprising a bi-directional power bus, a bi-directional communication bus, a sub-module power and ground line and a digital input/output line.

In some aspects, the battery module may comprise a backplane connector for signal and power connections. The chassis of the battery module may also comprise one or more fans to provide airflow through an interior of the chassis. In some aspects, a metal bezel may be attached to a front end of the chassis. The metal bezel may comprise a ventilation pattern to provide airflow through an interior of the chassis. Contactors adapted to control connection of a DC voltage output to a DC high voltage power bus of an energy storage system may be disposed in the chassis in some aspects.

In accordance with some embodiments, a plurality of sub-modules of a first or second type may be interconnected to a battery pack controller in a battery pack by connecting a plurality of sub-modules of a first type in series, parallel or both to create a high voltage power bus. The plurality of sub-modules of the first type may be replaceable with a plurality of sub-modules of a second type to create the power bus. The example method may further comprise electrically coupling the plurality of sub-modules of the first or second type to a battery pack controller via a bi-directional high voltage power bus and a power supply bus. In some aspects, the example method may further comprise communicatively coupling the plurality of sub-modules to the battery pack controller via a sub-module communication bus and one or more digital I/O connections.

In some aspects, the plurality of sub-modules of the first type comprises lithium-ion cells of cylindrical form factor and the plurality of sub-modules of the second type comprises lithium-ion cells of prismatic or pouch form factor. In other aspects, voltage on the high voltage power bus is 300V or at least 48V. The voltage on the high voltage power bus may be electrically coupling to a load. In some aspects, the battery pack controller may be coupled to an external communication bus separate from the sub-module or internal communication bus.

In accordance with some embodiments, a sub-module configured to be connected with one or more other sub-modules to create a battery pack with a targeted pack voltage and energy density may comprise lithium ion cell sub-modules comprising lithium ion cells of the same type, components for executing cell monitoring and balancing functions, a sub-module interface adapted for interconnecting with a battery pack controller including a power terminal for coupling with a bi-directional DC power bus, a power terminal for coupling with a power supply bus, one or more digital I/O terminals for coupling one or more digital I/O links and a communication terminal for coupling with a communication bus.

BRIEF DESCRIPTION OF THE DRAWINGS

FIGS. 3A and 3B are diagrams illustrating a sub-module comprising cylindrical cells and pouch cells respectively.

DETAILED DESCRIPTION

Lithium-ion battery packs or modules can be made using any of a number of cell technologies such as, but not limited to: lithium-ion Iron Phosphate (LFP), lithium-ion Nickel Manganese Cobalt Oxide (NMC) and lithium-ion Nickel Cobalt Oxide (NCA). The lithium-ion cells are available in different form factors (e.g., cylindrical, prismatic, pouch). One of the disadvantages of existing lithium-ion battery packs is that they are designed for a specific cell technology and form factor offered by a cell manufacturer (e.g., Sony). This level of customization means that it is not possible to switch from cells made by one cell manufacturer to another without changing the battery pack design. Consequently, the battery pack would need to be redesigned to accommodate the new cells without affecting the output voltage, energy density, and/or other characteristics such as performance and reliability. Once the battery pack is redesigned, it becomes necessary to bring the battery pack under regulatory compliance (e.g., Underwriters Laboratories (UL) certification). Certification for lithium-ion battery packs having voltages greater than 60V is already a challenging process, but with the certification standards generally varying from country to country, re-certification can require significant time and effort. Thus, changing the cell technology/form factor/supplier for a battery pack can involve not just a redesign of the battery pack but also recertification, all of which can be time consuming and costly. Because of these inefficiencies, battery pack manufacturers are often stuck with the same cell supplier which can impact their ability to produce battery packs at a competitive cost or resolve cell quality issues.

The battery pack described in the present disclosure has a sub-module based architecture, which helps make the battery pack effectively "cell agnostic," thereby addressing the challenges of existing battery packs. The cell agnostic battery pack comprises one or more sub-modules connected to a battery pack controller via an internal interconnect interface. The sub-modules comprise lithium-ion cells of any cell technology and type (e.g., cylindrical, pouch, prismatic), and as such can be supplied by any cell supplier. The sub-modules can be interconnected in series, parallel or both series and parallel to create a power bus (e.g., 150V, 300V). Moreover, the sub-modules can be individually certified (e.g., by cell suppliers that manufacture the sub-modules), which reduces the burden on the battery pack manufacturer to recertify the battery pack when switching from a sub-module made by one cell supplier to another cell supplier.

These and various other embodiments, aspects and advantages of the cell agnostic battery pack will now be described in detail.

Figure 1:
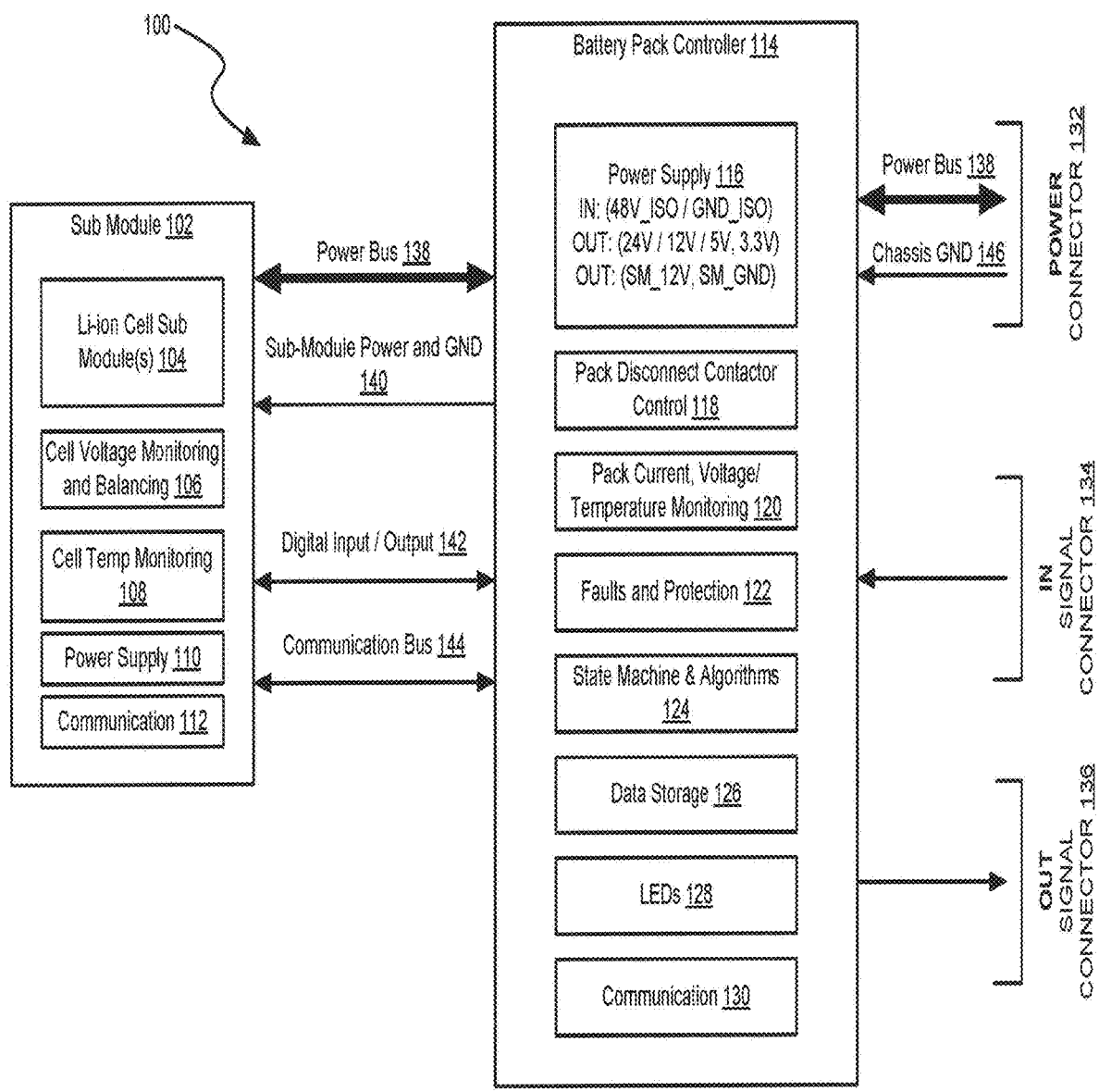
FIG. 1 is a diagram illustrating example components of a battery pack in accordance with some embodiments.

FIG. 1 is a block diagram illustrating example components of a cell agnostic battery pack 100 in accordance with some embodiments. The battery pack 100 comprises at least one sub-module 102. In some aspects, the battery pack 100 can comprise multiple sub-modules 102 connected in series, parallel or series and parallel to provide a target pack voltage and energy density. By way of example, a target pack voltage and energy density of an example battery pack having multiple modules can be 300V and 7 kWh.

The sub-module 102 comprises cells and cell assembles. As depicted in FIG. 1, the sub-module 102 comprises one or more lithium-ion cell sub-modules 104. The lithium-ion cell sub-modules 104 in turn comprise lithium-ion cells of a specific form factor (e.g., cylindrical, pouch, prismatic) and cell technology. FIG. 3A depicts an example arrangement of 8 cylindrical cell sub-modules 104A disposed in a sub-module 102. Similarly, FIG. 3B depicts an example arrangement of 4 pouch cell sub-modules 104B disposed in a sub-module 102.

In some aspects, the sub-module 102 further comprises control and monitoring electronics for safety and/or operational efficiency. By way of example, the sub-module 102 can include a cell voltage monitoring and balancing circuit 106 and cell temperature monitoring circuit 108 including temperature and/or other sensors. The cell voltage monitoring and balancing circuit 106 can monitor cell voltage and temperature (via cell temperature monitoring circuit 108) as these are generally indicative of impending faults or failure, and balance cell and string voltage based on external command (e.g., from battery pack controller 114).

The sub-module 102 also comprises a power supply module 110 and a communication module 112. The power supply module 110 supplies power and ground 140 to the control and monitoring electronics. The communication module 112 supports receiving and sending of data over a communication bus 144. In some aspects, the communication bus 144 can be a Controller Area Network (CAN) bus. The sub-module 102, in some aspects, includes one or more digital I/O pins through which digital I/O link 142 can be communicated. By way of example, emergency fault (e.g., cell over voltage) can be reported through a digital I/O link 142.

The battery pack 100 also comprises a battery pack controller 114. Embodiments of the battery pack controller 114 can include various modules for controlling and managing the battery pack 100. By way of example, the battery pack controller 114 can include modules for power supply 116, a pack disconnect contactor control 118, monitoring 120, fault and protection 122, state machine and algorithms 124, data storage 126, light emitting diode control 128 and communication 130.

The monitoring module 120 can monitor pack voltage, current, temperature, and/or other operating characteristics of the sub-modules 102. The fault and protection module 122 can protect the battery pack 100 against over voltage, under voltage, over temperature, ground fault, and/or other fault conditions using redundant analog measurement (e.g., from the monitoring module 120). The pack disconnect contactor control 118 can control the contactors to connect or disconnect the battery pack 100 from a load (e.g., high voltage power bus). The state machine and algorithms 124 can include logic for battery pack state machine, auto addressing, firmware upgrade, warranty model, SOC, SOH and EOL, and the like. The data storage module 126 can include non-volatile (NV) storage for data logging, firmware upgrade, factory data, and the like.

The light emitting diode control 128 can include logic for controlling an LED light pipe. In some aspects, the LED light pipe can provide an indication of the health of the sub-modules. For example, the LED light pipe can turn red from green to indicate failure of one or more sub-modules.

The communication module 130 can support communication with the sub-modules 102 over an internal communication bus 144. The communication module 130 can also support communication with external modules (e.g., other battery packs, a battery management system) over a separate and independent external communication bus.

Figure 2:
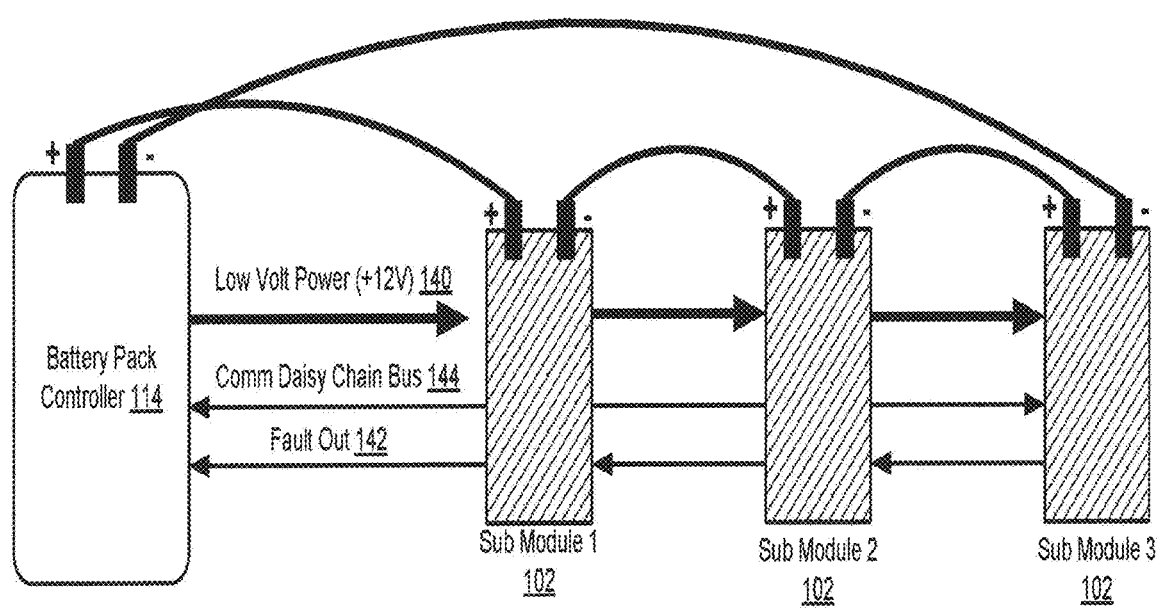
FIG. 2 is a diagram illustrating interconnection of sub-modules to a battery pack controller in accordance with some embodiments.

The battery pack controller 114 and the sub-modules 102 are electrically and communicatively connected or coupled via internal interconnects. In some embodiments, the internal interconnects coupling the battery pack controller 114 and the sub-modules 102 include a power bus 138, sub-module power and ground line 140, one or more digital I/O line(s) 142 and a communication bus 144. The power bus 138 interconnects a power connector on the battery pack controller 114 with complementary power connectors on the sub-modules 102. The power bus 138 is created by combining the sub-modules output voltages in series, parallel or series and parallel. By way of example, FIG. 2 depicts sub-modules 1-3 connected in series to create a power bus 138 that is coupled to the battery pack controller 114.

The sub-module power and ground line 140 interconnects a power connector on the battery pack controller 114 to complementary power connectors on the sub-modules 102 to supply low voltage power (e.g., +12V) to the sub-modules (e.g., for operating the monitoring and balancing electronics). The one or more digital I/O lines 142 interconnect one or more digital I/O pins/connectors on the battery pack controller 114 to complementary digital I/O pins/connectors on the sub-modules 102. The digital I/O line 142 may be utilized by the sub-modules 102 for reporting emergency fault (e.g., cell over voltage, cell temperature exceeding a threshold, etc.) to the battery pack controller 114 in some aspects. In some aspects, the pack controller 114 can utilize the digital I/O lines 142 to send the sub-modules requests and/or responses. For example, the pack controller 114 can send charge voltage threshold, commands (e.g., go into sleep state), or the like to the sub-modules via the digital I/O lines 142. The internal communication bus 144 interconnects a communication connector on the battery pack controller 114 to complementary communication connectors on the sub-modules to communicate data. Examples of such data can include temperate, voltage, current, cell health/status, other operating characteristics and/or data from the monitoring and balancing of the sub-modules 102. The battery pack controller 114 can, in some aspects, send commands or requests to the sub-modules 102 in response to reported faults or other conditions (e.g., command to balance cell and string voltage) over the internal communication bus. Referring to FIG. 2, the communication bus 144 as depicted can be a bi-directional daisy chain bus.

The battery pack controller 114 comprises external interconnects including a power bus 138, a chassis ground 146 and signal in and signal out lines which are coupled to power connector 132, signal connector 134 and signal connector 136 respectively. Via the power bus and signal in/out lines, the battery pack 100 may be coupled with one or more other battery packs, external modules and/or load.

Figure 4:
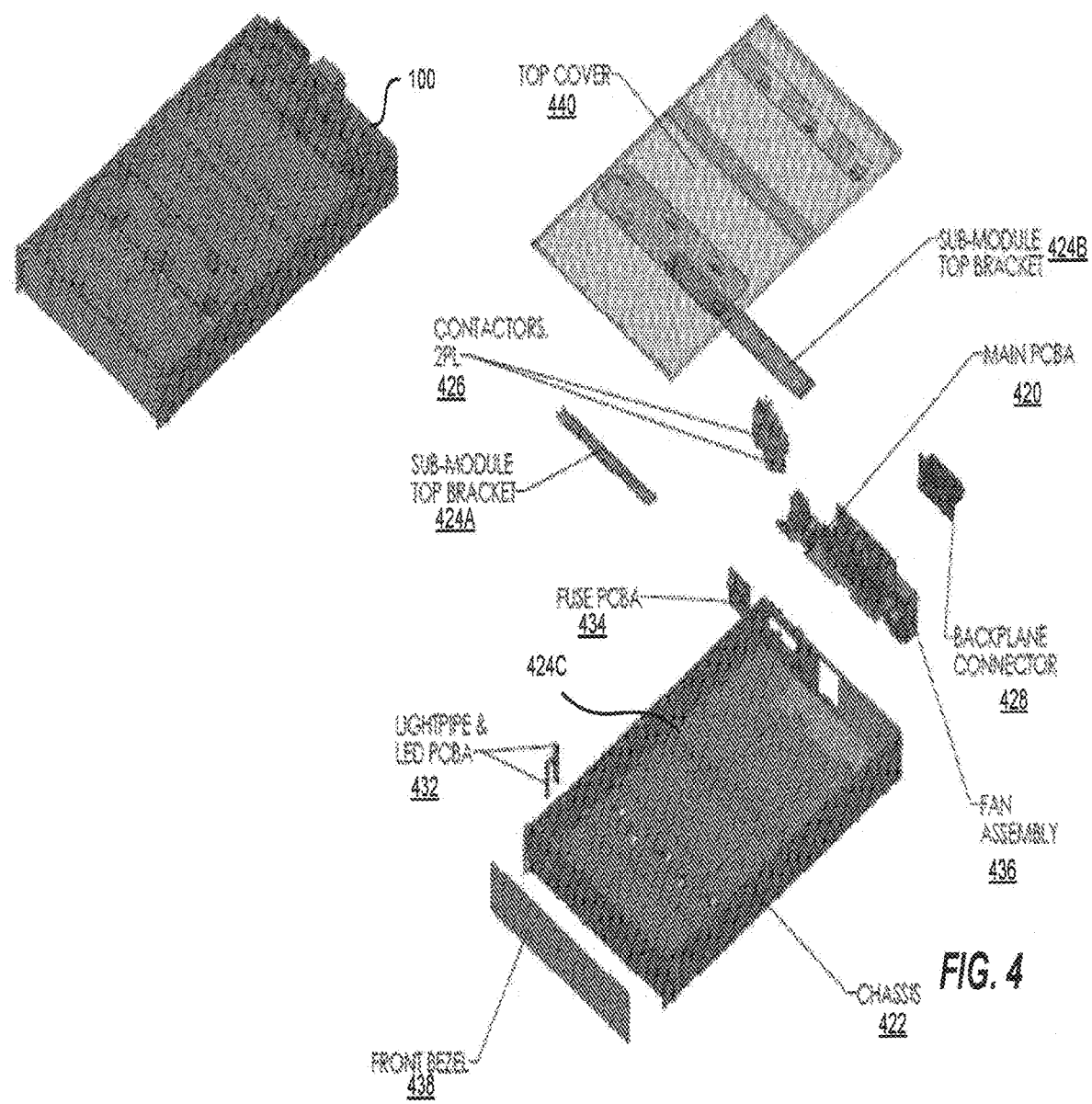
FIG. 4 is a diagram illustrating a 3D exploded view of a battery pack in accordance with some embodiments.

FIG. 4 depicts a cell agnostic battery pack 100 in accordance with some embodiments. The battery pack 100 comprises a chassis 422 having compartments for receiving sub-modules 102. For clarity, the sub-modules 102 are not shown. The chassis 422 has a number of compartments to receive a number of sub-modules 102. The sub-modules can be secured inside the chassis via sub-module brackets 424A, 424B, 424C. Bus bars, wires or other suitable electrical coupling means can be used for connecting the sub-module power bus in series, parallel or a combination thereof to create a desired battery pack voltage (e.g., battery voltage of 300V) and energy density. Each of the connectors (e.g., power connector 132, IN signal connector 134 and OUT signal connector 136) on the battery pack controller 114 can be metal connectors disposed on the outside edge of the battery pack 100. The battery pack 100 includes one or more contactors 426 for selectively electrically coupling the battery pack output to that of other battery packs or to an electrical load external to the battery pack. The one or more contactors 426 can be actuated in response to signal from the pack disconnect contactor control module 118.

Figure 5:
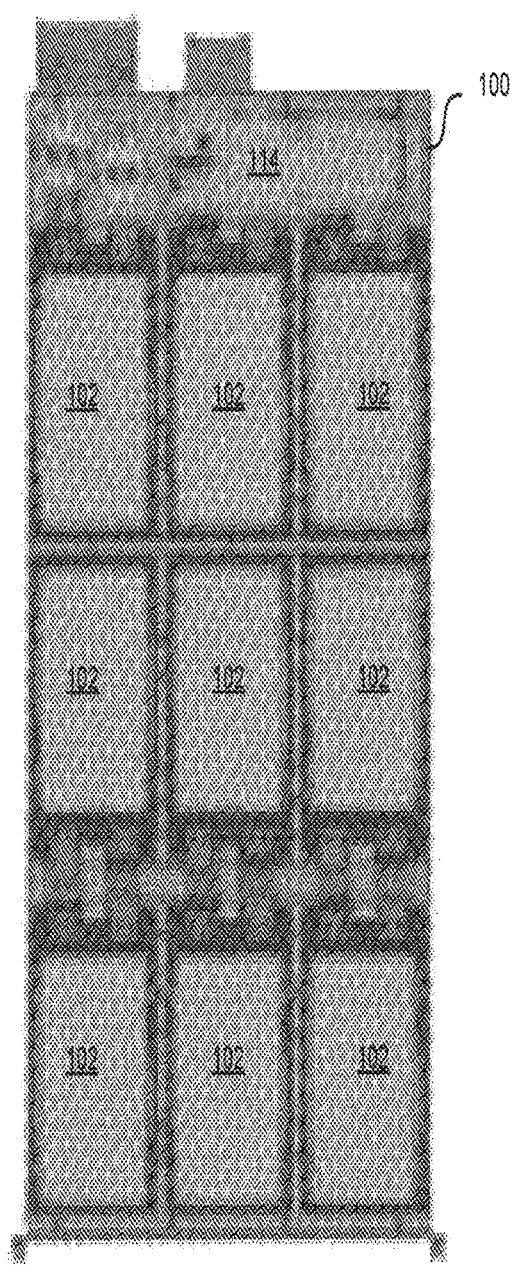
FIG. 5 is a diagram illustrating a battery pack including a group of sub-modules in accordance with some embodiments.

The chassis 422 includes a number of printed circuit board assemblies for the battery pack controller 114, fuse circuit 434, light pipe and LED circuit 432. A fan assembly 436 may also be disposed in the chassis 422 to induce air flow through the interior of the chassis 422. A front bezel 438 can be secured on to the front face of the chassis 422. In some embodiments, the front bezel 438 can have a ventilation pattern to promote air flow through an interior of the chassis 422. A removable top cover 440 affixes to the chassis 422 to form the battery pack 100 as depicted. An example of a battery pack 100 including nine sub-modules 102 inserted into compartments in the chassis is depicted in FIG. 5. In this example embodiment, the nine sub-modules 102 are connected via bus bars in series and parallel configuration to create a target pack voltage and energy density. The sub-modules 102 are coupled with the battery pack controller 114 the PCB via the internal interconnects described in reference to FIGS. 1 and 2.

Figure 6:
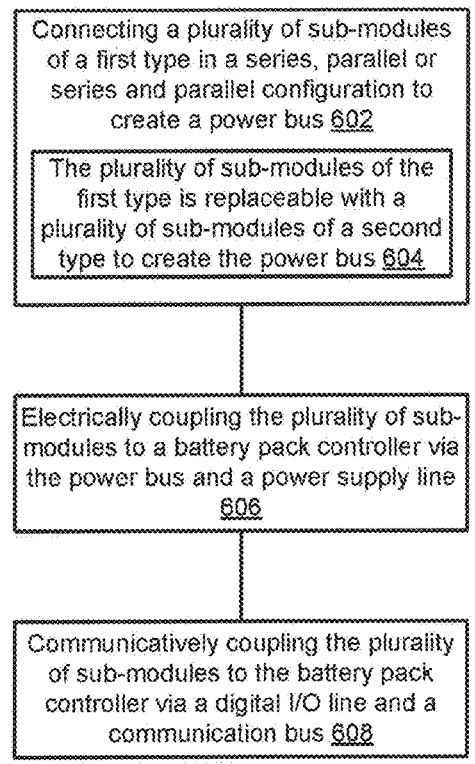
FIG. 6 is a diagram illustrating an example method of interconnecting a plurality of sub-modules of a first or second type to a battery pack controller in a battery pack.

FIG. 6 is a diagram illustrating an example method of interconnecting a plurality of sub-modules of a first or second type to a battery pack controller in a battery pack. The example method comprises connecting a plurality of sub-modules of a first type in series, parallel or both to create a high voltage power bus at block 602. At block 604, the plurality of sub-modules of the first type can be replaced with a plurality of sub-modules of a second type to create the power bus. In some aspects, the plurality of sub-modules of the first type comprises cylindrical lithium-ion cells and the plurality of sub-modules of the second type comprises prismatic or pouch lithium-ion cells. In other aspects, the plurality of sub-modules of the first type comprises lithium-ion cells made by a first supplier and the plurality of sub-modules of the second type comprises lithium-ion cells made by a second supplier. In yet other aspects, the plurality of sub-modules of the first type comprises lithium-ion cells based on a first technology and the plurality of sub-modules of the second type comprises lithium-ion cells based on a second technology.

The example method further comprises electrically coupling the plurality of sub-modules of the first or second type to a battery pack controller via a bi-directional high voltage power bus and a power supply at block 606. At block 608, the example method comprises communicatively coupling the plurality of sub-modules to the battery pack controller via a sub-module communication bus and one or more digital I/Os.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

From the foregoing, it will be appreciated that specific embodiments have been described herein for purposes of illustration, but that various modifications may be made without deviating from the spirit and scope of the embodiments. Accordingly, the embodiments are not limited except as by the appended claims.

What is claimed is:

1. A cell agnostic battery module comprising:
a cell agnostic battery module chassis comprising:
compartments receiving sub-modules of a first type and a second type, the sub-modules including lithium-ion cells and being connectable in series, parallel or series and parallel; and
a battery pack controller; and
internal interconnects coupling the sub-modules received in the compartments to the battery pack controller, the internal interconnects comprising:
a sub-module power bus coupling a power connector on the battery pack controller with complementary power connectors on the sub-modules; and
a sub-module communication bus coupling at least one communication connector on the battery pack controller with complementary communication connectors on the sub-modules.

2. The cell agnostic battery module of claim 1, wherein the battery pack controller further comprises external interconnects coupling with signal and power connectors on the battery pack controller.

3. The cell agnostic battery module of claim 1, wherein the internal interconnects further comprise low voltage power coupling with a power and ground connector on the battery pack controller with complementary power and ground connectors on the sub-modules to supply low voltage power to the sub-modules.

4. The cell agnostic battery module of claim 3, wherein the internal interconnects further comprise a digital I/O coupling a digital I/O connector on the battery pack controller with complementary digital I/O connectors on the sub-modules to receive/send a digital I/O signal.

5. The cell agnostic battery module of claim 1, wherein the sub-modules of the first type and the second type comprise lithium-ion battery cells of different shapes.

6. The cell agnostic battery module of claim 5, wherein at least one of the different shapes is at least one of cylindrical type, pouch type, or prismatic type.

7. The cell agnostic battery module of claim 1, wherein the sub-modules of the first type and the second type include sub-modules from distinct manufacturing sources.

8. The cell agnostic battery module of claim 1, wherein the sub-modules of the first type and the second type include sub-modules using at least one of nickel-cadmium, nickel-metal-hydride, lead-acid, lithium-ion, or lithium-ion-polymer cell chemistry.

9. The cell agnostic battery module of claim 1, wherein the cell agnostic battery module chassis further comprises one or more fans to provide airflow through an interior of the cell agnostic battery module chassis and a metal bezel attached to a front end of the cell agnostic battery module chassis, the metal bezel comprising a ventilation pattern to provide airflow through the interior of the cell agnostic battery module chassis.

10. A battery module, comprising:
a cell agnostic battery module chassis having at least two compartments configured to receive at least two sub-modules, wherein each sub-module comprises lithium-ion cells of at least one of a cylindrical shape, pouch shape or prismatic shape, the at least two sub-modules connected in series or parallel to provide a target pack voltage and a target energy density; and
a battery module controller disposed in the cell agnostic battery module chassis, and electrically coupled with the at least two sub-modules via internal interconnects comprising:
a bi-directional power bus;
a bi-directional communication bus;
a sub-module power and ground line; and
a digital input/output line.

11. The battery module of claim 10, further comprising a backplane connector for signal and power connections.

12. The battery module of claim 10, wherein the cell agnostic battery module chassis comprises one or more fans to provide airflow through an interior of the cell agnostic battery module chassis.

13. The battery module of claim 10, further comprising a metal bezel attached to a front end of the cell agnostic battery module chassis, the metal bezel comprising a ventilation pattern to provide airflow through an interior of the cell agnostic battery module chassis.

14. The battery module of claim 10, further comprising contactors adapted to control connection of a DC voltage output to a DC high voltage power bus of an energy storage system.

15. A method of interconnecting a plurality of sub-modules of a first or second type to a battery pack controller in a battery pack, comprising:
connecting the plurality of a first type of sub-modules in series, parallel, or both to create a power bus, wherein the plurality of the first type of sub-modules are replaceable with the plurality of a second type of sub-modules to create the power bus;
electrically coupling the plurality of sub-modules of the first or second type to the battery pack controller via:
the power bus; and
a power supply bus;
communicatively coupling the plurality of sub-modules of the first or the second type to the battery pack controller via:
a sub-module communication bus; and
one or more digital I/O connections.

16. The method of claim 15, wherein the plurality of sub-modules of the first type comprises lithium-ion cells of a cylindrical shape and the plurality of sub-modules of the second type comprises lithium-ion cells of at least one of a prismatic or pouch shape.

17. The method of claim 15, wherein voltage on the power bus is 300V.

18. The method of claim 15, further comprising electrically coupling voltage on the power bus to a load.

19. The method of claim 15, further comprising coupling the battery pack controller to an external communication bus separate from the sub-module communication bus.

20. A sub-module connected with one or more other sub-modules to create a battery pack with a targeted pack voltage and energy density, comprising:
lithium ion cell sub-modules comprising lithium ion cells;
components for executing cell monitoring and balancing functions;
a sub-module interface interconnecting with a battery pack controller including:
a power terminal for coupling with a bi-directional DC power bus;
a power terminal for coupling with a power supply bus;
one or more digital I/O terminals for coupling one or more digital I/O links; and
a communication terminal for coupling with a communication bus.

* * * * *